United States Patent
Kawakami

(10) Patent No.: US 8,793,540 B2
(45) Date of Patent: Jul. 29, 2014

(54) TEST APPARATUS AND TEST METHOD

(75) Inventor: Takeshi Kawakami, Gunma (JP)

(73) Assignee: Advantest Corporation, Tokyo (JP)

( * ) Notice: Subject to any disclaimer, the term of this patent is extended or adjusted under 35 U.S.C. 154(b) by 259 days.

(21) Appl. No.: 13/541,670

(22) Filed: Jul. 4, 2012

(65) Prior Publication Data

US 2013/0086423 A1 Apr. 4, 2013

(30) Foreign Application Priority Data

Sep. 29, 2011 (JP) ................................ 2011-215536

(51) Int. Cl.
*G06F 11/00* (2006.01)
*G11C 29/56* (2006.01)

(52) U.S. Cl.
CPC ............................... *G11C 29/56004* (2013.01)
USPC ................... 714/53; 714/27; 714/32; 714/42; 714/49

(58) Field of Classification Search
USPC ..................... 714/27, 32, 42, 49, 53
See application file for complete search history.

(56) References Cited

U.S. PATENT DOCUMENTS 8,201,035 B2 * 6/2012 Wang et al. .................... 714/719
2003/0088816 A1 * 5/2003 Wu et al. ........................ 714/723

* cited by examiner

*Primary Examiner* — Joshua P Lottich

(57) ABSTRACT

Provided is a test apparatus including: an address generator that generates an address of a memory under test; a selector that selects whether to perform bit inversion on the address generated by the address generator before supplying the address to the memory under test; an inversion processing section that outputs the address generated by the address generator after performing bit inversion on the address if the selector has selected in the affirmative, and outputs the address generated by the address generator without performing any bit inversion on the address if the selector has selected in the negative; and a supply section that supplies, to the memory under test, the address having undergone inversion control outputted from the inversion processing section and an inversion cycle signal that indicates whether the address outputted from the inversion processing section is bit inverted or not.

10 Claims, 7 Drawing Sheets

TEST APPARATUS AND TEST METHOD

BACKGROUND

1. Technical Field

The present invention relates to a test apparatus and a test method.

2. Related Art

A test apparatus of a semiconductor memory such as DRAM and SRAM writes data to a memory under test, and reads the written data from the memory under test. The test apparatus then compares the read data with an expected value, for detecting a failed cell of the memory under test.

Recent years have seen growing attention to the problem of power consumption increase of these memories as they have a higher speed and a larger capacity. Semiconductor memories operable to switch whether to receive bit inverted addresses and receive non-bit inverted addresses appear on the market in response to this trend. A controller accessing this type of semiconductor memory can provide it with addresses with less change in bits. Accordingly, this type of semiconductor memory can have reduced power consumption inherent in address processing can be reduced with.

The test apparatus writes data to or read data from a predetermined address of a memory under test, by executing a test program created in advance. Therefore, when testing such a semiconductor memory, it has been necessary to create the test program taking into consideration whether the address should undergo bit inversion or not in advance. This makes creation of the test program for testing semiconductor memories difficult and troublesome.

SUMMARY

To solve the above problems, according to an aspect related to the innovations herein, provided are a test apparatus and a test method that can solve the above-mentioned problems. This is achieved by the combination of the features recited in the claims. According to a first aspect related to the innovations herein, provided is a test apparatus including: an address generator that generates an address of a memory under test; a selector that selects whether to perform bit inversion on the address generated by the address generator before supplying the address to the memory under test; an inversion processing section that outputs the address generated by the address generator after performing bit inversion on the address if the selector has selected in the affirmative, and outputs the address generated by the address generator without performing any bit inversion on the address if the selector has selected in the negative; and a supply section that supplies, to the memory under test, the address having undergone inversion control outputted from the inversion processing section and an inversion cycle signal that indicates whether the address outputted from the inversion processing section is bit inverted or not.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
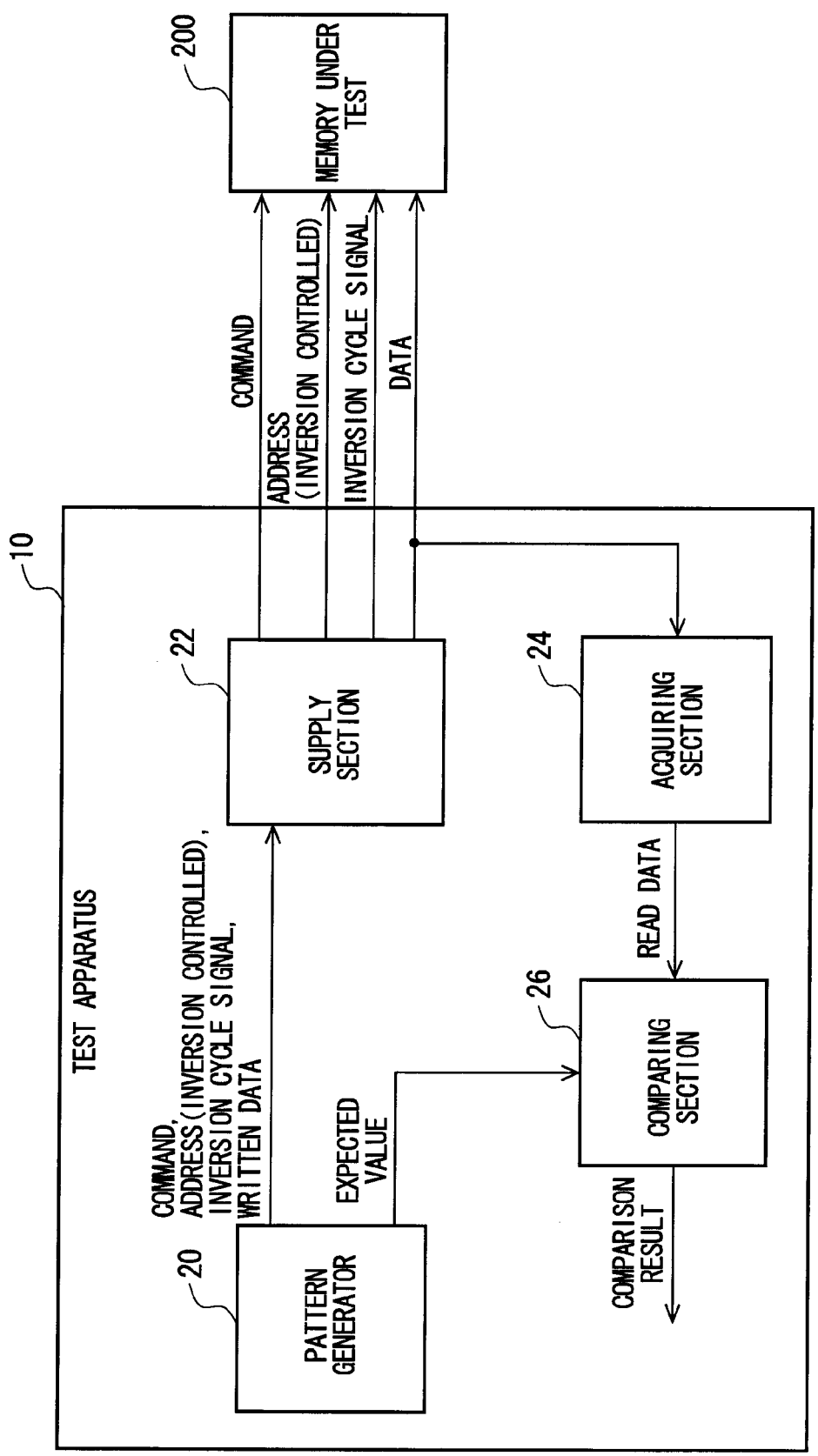
FIG. 1 shows the structure of a test apparatus 10 according to the present embodiment, together with a memory under test 200.

FIG. 1 shows the structure of a test apparatus 10 according to the present embodiment, together with a memory under test 200.

The memory under test 200 is accessed from an external controller through a DDR (Double Data Rate) interface. The DDR interface transfers, in parallel, a plurality of data signals DQ and a clock signal DQS that shows a timing at which the data signals DQ are sampled. A plurality of data signals and a clock signal at a rate which is double the rate of the data signal are transported in parallel between the memory under test 200 and the external controller. The memory under test 200 uses such a DDR interface, and one example of which is a GDDR5 (Graphics Double Data Rate 5) memory.

The memory under test 200 receives data to be written, from the external controller via the DDR interface for data transfer. The memory under test 200 also outputs data called for reading, to the external controller via the data-transfer DDR interface.

The memory under test 200 receives an address from the external controller via the address-transfer DDR interface. The memory under test 200 writes data to and reads data from a recording region designated by the received address.

The memory under test 200 receives a command from the external controller. The memory under test 200 performs such processing as writing of data, reading of data, and no-operation (NOP), according to the contents indicated by the received command.

In addition, the memory under test 200 receives an inversion cycle signal from the external controller. The inversion cycle signal is transferred to the memory under test 200 from the external controller, together with the address transferred from the external controller to the memory under test 200. The inversion cycle signal indicates whether the address transferred synchronously has undergone bit inversion or not.

For example, if it is H logic, the inversion cycle signal shows that the address transferred synchronously has undergone bit inversion. If it is L logic, on the other hand, the inversion cycle signal shows that the address transferred synchronously has not undergone bit conversion.

When the inversion cycle signal indicates bit inversion, the memory under test 200 converts the value of the address received from the external controller to a bit inverted value, and writes data to or reads data from a recording region of the converted address. On the contrary, when the inversion cycle signal indicates that it has not undergone bit inversion, the memory under test 200 writes data to or reads data from a recording region indicated by the value of the address received from the external controller.

The external controller that writes data to and reads data from the memory under test 200 performs bit inversion to the values of the addresses sequentially transferred to the memory under test 200, so that the amount of change in logic values of the bits becomes smaller. Then, the memory under test 200 supplies, to the memory under test 200, the inversion cycle signal together with the address to which inversion control has been performed. According to this operation, the memory under test 200 can restrain power consumption incurred by change in the logic value of each bit of an address.

The test apparatus 10 includes a pattern generator 20, a supply section 22, an acquiring section 24, and a comparing section 26. The test apparatus 10 according to the present embodiment tests the memory under test 200.

The pattern generator 20 runs a test program, and sequentially generates a command, an address, an inversion cycle signal, and data to be written, which are to be supplied to the memory under test 200. Furthermore, the pattern generator 20 runs a test program, to sequentially generate expected values of data to be read, which are to be outputted from the memory under test 200.

The supply section 22 supplies, to the memory under test 200, the command, the address, the inversion cycle signal, and the data to be written, having been generated by the pattern generator 20. The acquiring section 24 acquires the data to be read, after outputted from the memory under test 200.

The comparing section 26 compares the data to be read, having been acquired by the acquiring section 24, with the expected value generated by the pattern generator 20. Subsequently, the comparing section 26 outputs the comparison result between the data to be read and the expected value.

The test apparatus 10 as described above writes data to the memory under test 200 prior to shipping of the memory under test 200, and later reads the written data from the memory under test 200. Then, by comparing the read data with the expected value, the test apparatus 10 detects any failed cell that exists in the memory under test 200. By doing so, the test apparatus 10 can conduct a test to the memory under test 200.

Figure 2:
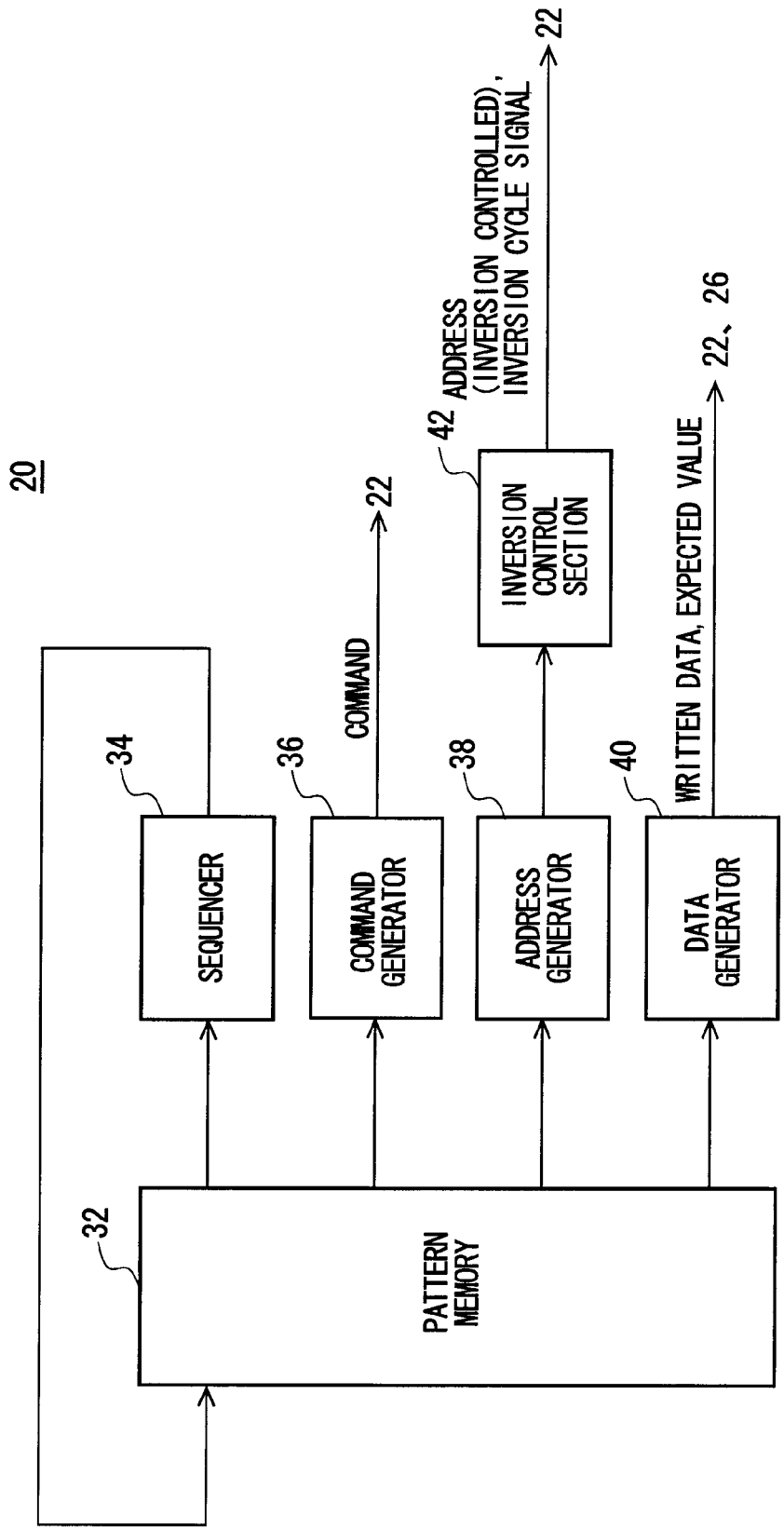
FIG. 2 shows the structure of a pattern generator 20 according to the present embodiment.

FIG. 2 shows the structure of a pattern generator 20 according to the present embodiment. The pattern generator 20 includes a pattern memory 32, a sequencer 34, a command generator 36, an address generator 38, a data generator 40, and an inversion control section 42.

The pattern generator 20 records a test instruction sequence (test program) including a plurality of test instructions sequentially executed by the sequencer 34. In addition, the pattern generator 20 records test patterns in correspondence with test instructions. A test pattern can be defined as a pattern of data that includes a command, an address, and data to be written, which are to be supplied to the memory under test 200, as well as data to be read, which is to be outputted from the memory under test 200.

The sequencer 34 sequentially executes test instructions included in a test instruction sequence so that one instruction is executed in each test cycle. The sequencer 34 designates the position at which the test instruction is to be executed in the next test cycle, according to the contents of the executed test instruction and the execution result.

In an example, when having executed no operation (NOP), the sequencer 34 designates the next position of the test instruction in the test sequence, as the position of the test instruction to be executed in the next test cycle. In an example, when having executed a branch instruction, the sequencer 34 switches the position of the test instruction to be executed in the next test cycle according to the branch condition. In this way, the sequencer 34 sequentially executes each test instruction included in a test instruction sequence.

The command generator 36 acquires the test patterns corresponded with the test instructions executed by the sequencer 34 in each test cycle, and generates a command included in the acquired test pattern. Then, the command generator 36 outputs the generated command to the supply section 22.

The address generator 38 acquires the test patterns corresponded with the test instructions executed by the sequencer 34 in each cycle, and generates an address included in the acquired test pattern. Then, the address generator 38 outputs the generated address to the inversion control section 42.

The data generator 40 acquires the test patterns corresponded with the test instructions executed by the sequencer 34 in each cycle, and generates data to be written and an expected value included in the acquired test pattern. Then, the data generator 40 outputs the generated data to be written, to the supply section 22. The data generating section 40 also outputs the generated expected value to the comparing section 26.

The inversion control section 42 acquires the address generated by the address generating section 38, and judges whether to perform bit inversion on the address. When it has been judged to perform bit inversion, the inversion control section 42 performs bit inversion on the address generated by the address generator 38, and outputs the bit inverted address to the supply section 22. When it has been judged not to perform bit inversion, the inversion control section 42 outputs, to the supply section 22, the address generated by the address generator 38 without performing bit inversion.

The inversion control section 42 also outputs an inversion cycle signal whose logic value switches depending on whether the address generated by the address generator 38 has been judged to undergo bit inversion. As explained above, the inversion control section 42 can output the inversion controlled address and the inversion cycle signal indicating whether the outputted address has undergone bit inversion, to the supply section 22.

Figure 3:
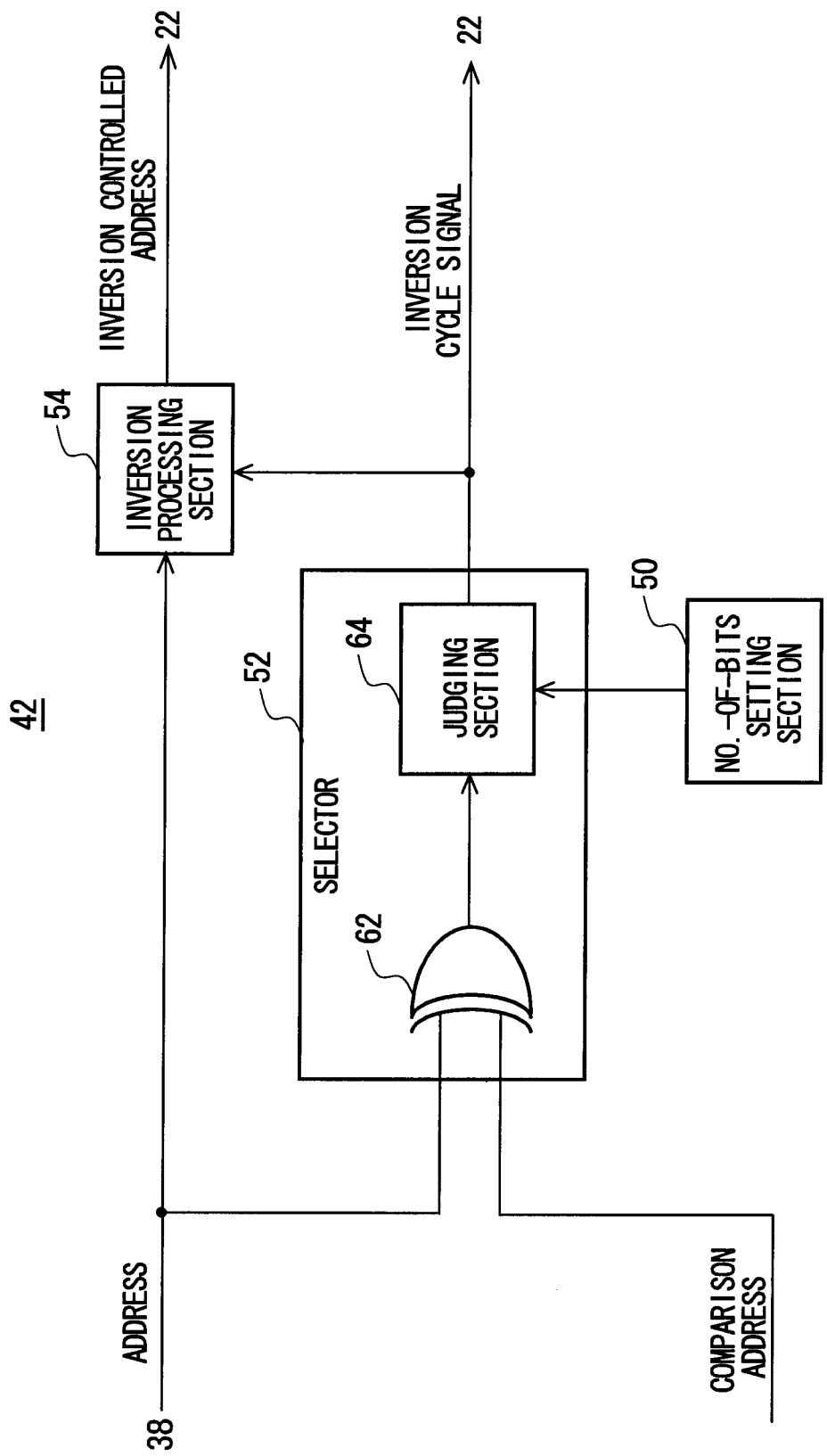
FIG. 3 shows a first example of the configuration of an inversion control section 42 according to the present embodiment.

FIG. 3 shows a first example of the configuration of an inversion control section 42 according to the present embodiment. The inversion control section 42 includes a number-of-bits setting section 50, a selector 52, and an inversion processing section 54.

Prior to a test, the number-of-bits setting section 50 sets, to the selector 52, the bit smaller than or equal to the bit width of the address supplied to the memory under test 200. An example of the number-of-bits setting section 50 is a register to which a value is written from an external control apparatus prior to a test. A value is written to the number-of-bits setting section 50 by the external control apparatus.

The number of bits set by the number-of-bits setting section 50 may be equivalent to or more than ½ the bit width of the address supplied to the memory under test 200. In an example, the number-of-bits setting section 50 sets 4 bits if the bit width of the address supplied to the memory under test 200 corresponds to 8 bits, and 5 bits if the bid width of the address supplied to the memory under test 200 is 9 bits.

The selector 52 receives the address generated by the address generator 38, as well as the comparison address set in advance to a register or the like. For example, the comparison address is a fixed value written to the register or the like in advance. In the present embodiment, the value of the comparison address is equivalent to the value outputted from the address generator 38 during a period in which no effective address is supplied to the memory under test 200. In an exemplary comparison address, all the bits are rendered as L logic (or zero).

Based on the address generated by the address generator 38 and the comparison address, the selector 52 selects whether to perform bit inversion on the address generated by the address generator 38, before supplying the address to the memory under test 200. To be specific, the selector 52 selects to perform bit inversion on the address, when the address generated by the address generator 38 is changed from the comparison address at least by the number of bits pre-set by the number-of-bits setting section 50. The selector 52 selects not to perform bit inversion on the address, when the address generated by the address generator 38 is not changed from the comparison address by the number of bits pre-set by the number-of-bits setting section 50.

In an example, the selector 52 selects to perform bit inversion on the address, when the change of the address generated by the address generator 38 from the comparison address is equal to or larger than the number of bits corresponding to ½ the bit width of the address. For example, the selector 52 decides to perform bit inversion on the address, when the address generated by the address generator 38 is changed from the comparison address by 4 bits or more when the bit width of the address is 8 bits or by 5 bits or more when the bit width of the address is 9 bits.

For example, the selector 52 includes a non-matching circuit 62 and a judging section 64. The non-matching circuit 62 compares the address generated by the address generator 38 and the comparison address for each bit, as to whether they do not match for each bit. The judging section 64 selects to perform bit inversion on the address when the number of bits judged not to match by the non-matching circuit 62 is the pre-set number of bits or more (e.g., ½ the bid width of the address or more). The judging section 64 selects not to perform bit inversion when the number of bits judged not to match by the non-matching circuit 62 is less than the pre-set number of bits.

The judging section 64 then outputs the inversion cycle signal of the logical value according to the selection result. For example, when having selected to perform bit inversion on the address, the judging section 64 outputs an inversion cycle signal of H logic, and outputs an inversion cycle signal of L logic when having selected not to perform bit inversion on the address.

The selector 52 supplies such an inversion cycle signal to the inversion processing section 54. The selector 52 also outputs the inversion cycle signal to the supply section 22.

The inversion processing section 54 receives an address generated by the address generator 38. When the selector 52 has selected to perform bit inversion on the address, the inversion processing section 54 performs bit inversion on the address generated by the address generator 38, and outputs the address having undergone the bit inversion. On the contrary, when the selector 52 has selected not to perform bit inversion on the address, the inversion processing section 54 outputs the address generated by the address generator 38 without performing thereto bit inversion.

To be more specific, the inversion processing section 54 switches between performing bit inversion and not performing bit inversion before outputting the address generated by the address generator 38, depending on the logic value of the inversion cycle signal. The inversion processing section 54 outputs the address whose inversion has been controlled in the above manner, to the supply section 22.

The inversion control section 42 explained above can select the one having a smaller amount of change from the comparison address, from between the address pattern whose address has been bit converted and the address pattern whose address has not been bit converted, and outputs the selected address. Accordingly, the inversion control section 42 can pursue bit inversion in an adequate manner, even without changing the test program executed by the address generator 38.

Figure 4:
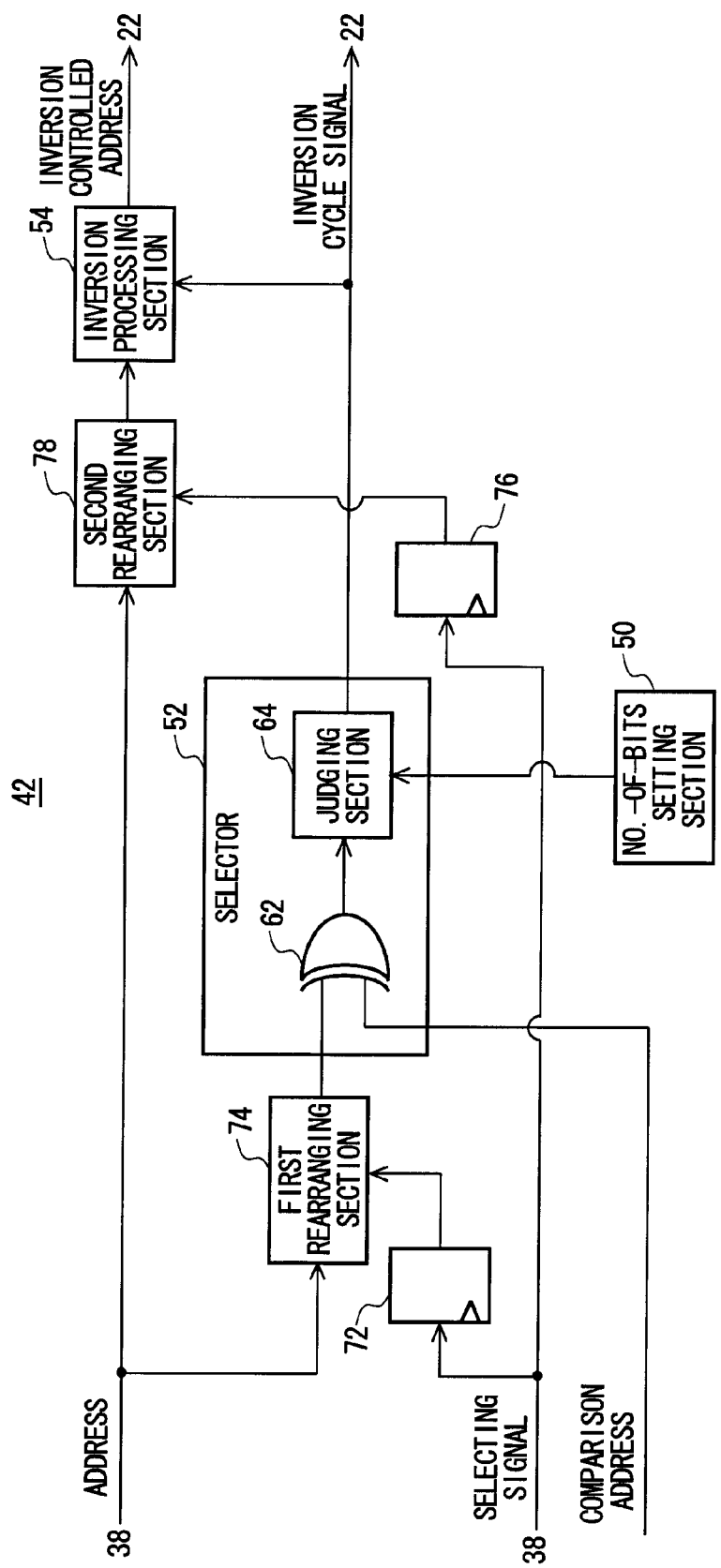
FIG. 4 shows a second example of the configuration of the inversion control section 42 according to the present embodiment.

FIG. 4 shows a second example of the configuration of the inversion control section 42 according to the present embodiment. The inversion control section 42 according to the second example is roughly the same in function and configuration as the inversion control section 42 in the first example shown in FIG. 3. Therefore, there will be no explanation provided below for the common function and configuration to those of the inversion control section 42 shown in FIG. 3.

Each bit in an address of the memory under test 200 is different in content depending on the contents of each command. With this in view, the test apparatus 10 selects and rearranges the address patterns included in the pattern data, depending on the contents of the command supplied to the memory under test 200, before supplying it to the memory under test 200.

The inversion control section 42 in the second example selects and rearranges each bit in the address pattern outputted from the address generator 38, together with the invertion processing on the address. The inversion control section 42 in the second example further includes a first register 72, a first rearranging section 74, a second register 76, and a second rearranging section 78.

The first register 72 acquires a selecting signal outputted from the address generator 38 in each test cycle, and retains it. The selecting signal includes information to designate which of the plurality of bits included in the address generated by the address generator 38 to be selected and how it is to be rearranged.

The first rearranging section 74 selects the bits designated by the selecting signal, from among the plurality of bits included in the address generated by the address generator 38, and rearranges the selected bits in the order designated by the selecting signal. An exemplary first rearranging section 74 converts a 24-bit address generated by the address generator 38 into either an 8-bit address or a 9-bit address. Then, the first rearranging section 74 outputs the selected and rearranged address to the selector 52.

The second register 76 acquires the selecting signal outputted from the address generator 38 in each test cycle and retains it. The second rearranging section 78 selects the bits designated by the selecting signal, from among the plurality of bits included in the address generated by the address generator 38, and rearranges the selected bits in the places designated by the selecting signal. In this example, the second rearranging section 78 pursues the rearrangement to adjust to each address pin of the memory under test 200. Then, the second rearranging section 78 outputs the selected and rearranged address to the inversion processing section 54.

The inversion control section 42 according to the second example can perform the inversion processing appropriately even when the contents indicated by bits of the address are different from each other according to the contents of each command.

Figure 5:
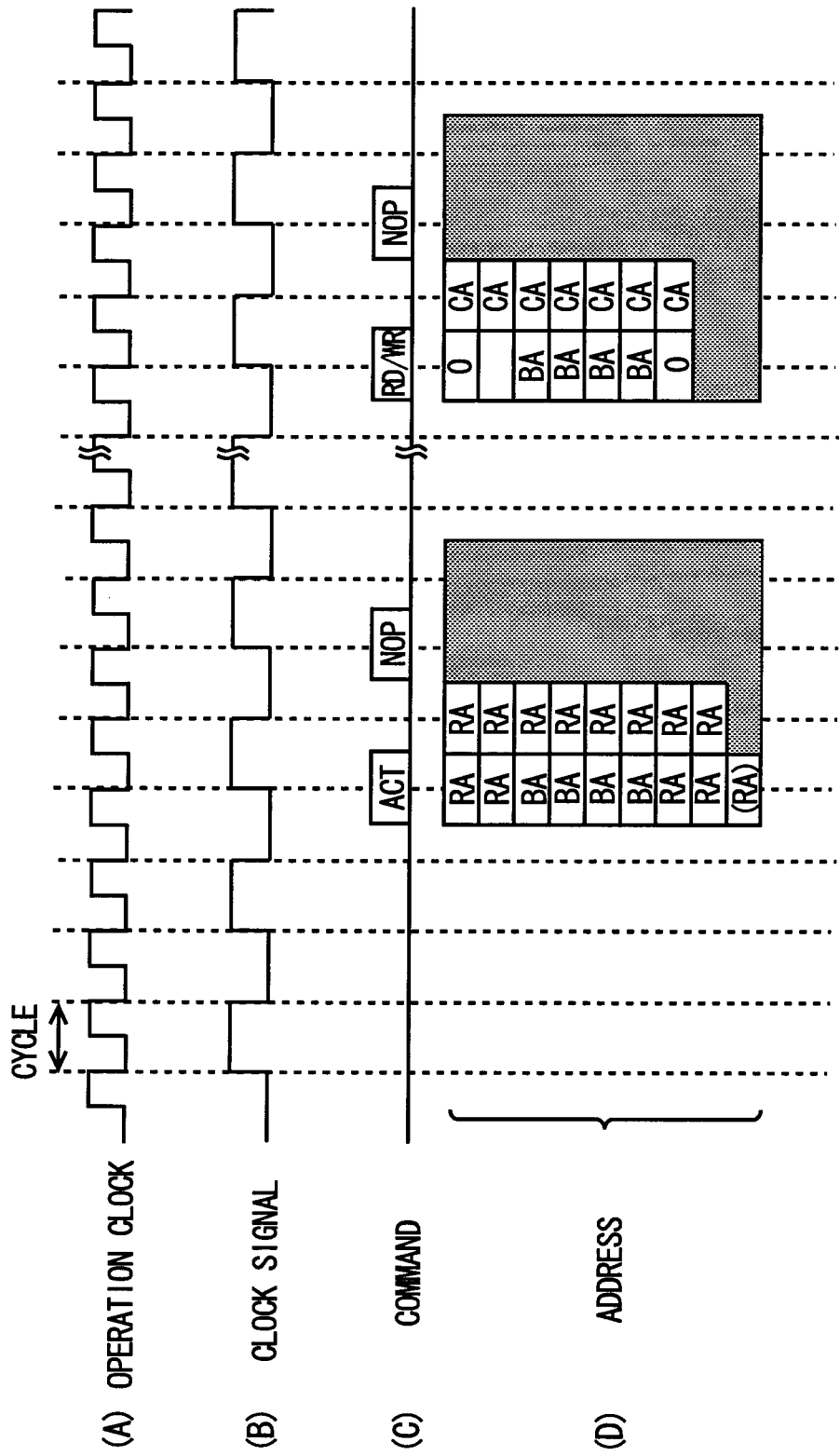
FIG. 5 shows an example of an operating clock, a clock signal, a command, an address, and a selection signal of the memory under test 200.

FIG. 5 shows an example of an operating clock, a clock signal, a command, an address, and a selection signal of the memory under test 200. As shown in (A) and (B) in FIG. 5, the memory under test 200 operates in synchronization with the operating clock having a rate twice the rate of the clock signal.

Therefore, the test apparatus 10 outputs an address at a rate twice the rate of the clock signal.

Also as shown in (C) of FIG. 5, the memory under test 200 executes the processing according to the command received in synchronization with the operating clock. The memory under test 200 may receive a bank active command (ACT), a read command (RD), a write command (WR), a no-operation command (NOP) and so on, and perform the corresponding operation. Accordingly, the command generator 36 of the pattern generator 20 sequentially outputs these various types of commands according to each test program.

Also as shown in (D) of FIG. 5, when receiving a command for accessing a particular recording region, the memory under test 200 receives, in addition to the command, two addresses included in consecutive two cycles. Then, the memory under test 200 accesses the recording region designated by the two addresses included in the consecutive two cycles. This means that when outputting a command to access a particular recording region, the address generator 38 of the pattern generator 20 outputs the consecutive two addresses to designate the recording region of the memory under test 200 to be accessed.

Also as (D) in FIG. 5 shows, the memory under test 200 receives addresses having bits different in contents for different commands. The memory under test 200 interprets an address taking into consideration the contents of the received command, and accesses the designated recording region. Accordingly, the inversion control section 42 of the pattern generator 20 selects and rearranges the value of each bit of the address outputted from the address generator 38, according to the contents of the command outputted to the memory under test 200 and at each output timing of the address.

The memory under test 200 does not receive any address unless it has received the command to access a particular recording region. Therefore, the address generator 38 of the pattern generator 20 supplies a predetermined fixed address to the memory under test 200, during a period in which no address is received by the memory under test 200. For example, the address generator 38 of the pattern generator 20 outputs the address in which all the bits are set to L logic (or zero) during a period in which no address is received by the memory under test 200.

The inversion control section 42 of the pattern generator 20 executes bit inversion control of an address, by setting, as the comparison address, the fixed address generated during a period in which no address is received by the memory under test 200. By doing so, the test apparatus 10 can minimize the amount of change in the unit of bit between the leading address and the address immediately therebefore, when it outputs two consecutive addresses together with a command. Also when the test apparatus 10 outputs two consecutive addresses together with a command, it can minimize the amount of change in the unit of bit between the trailing address and the address immediately thereafter.

Figure 6:
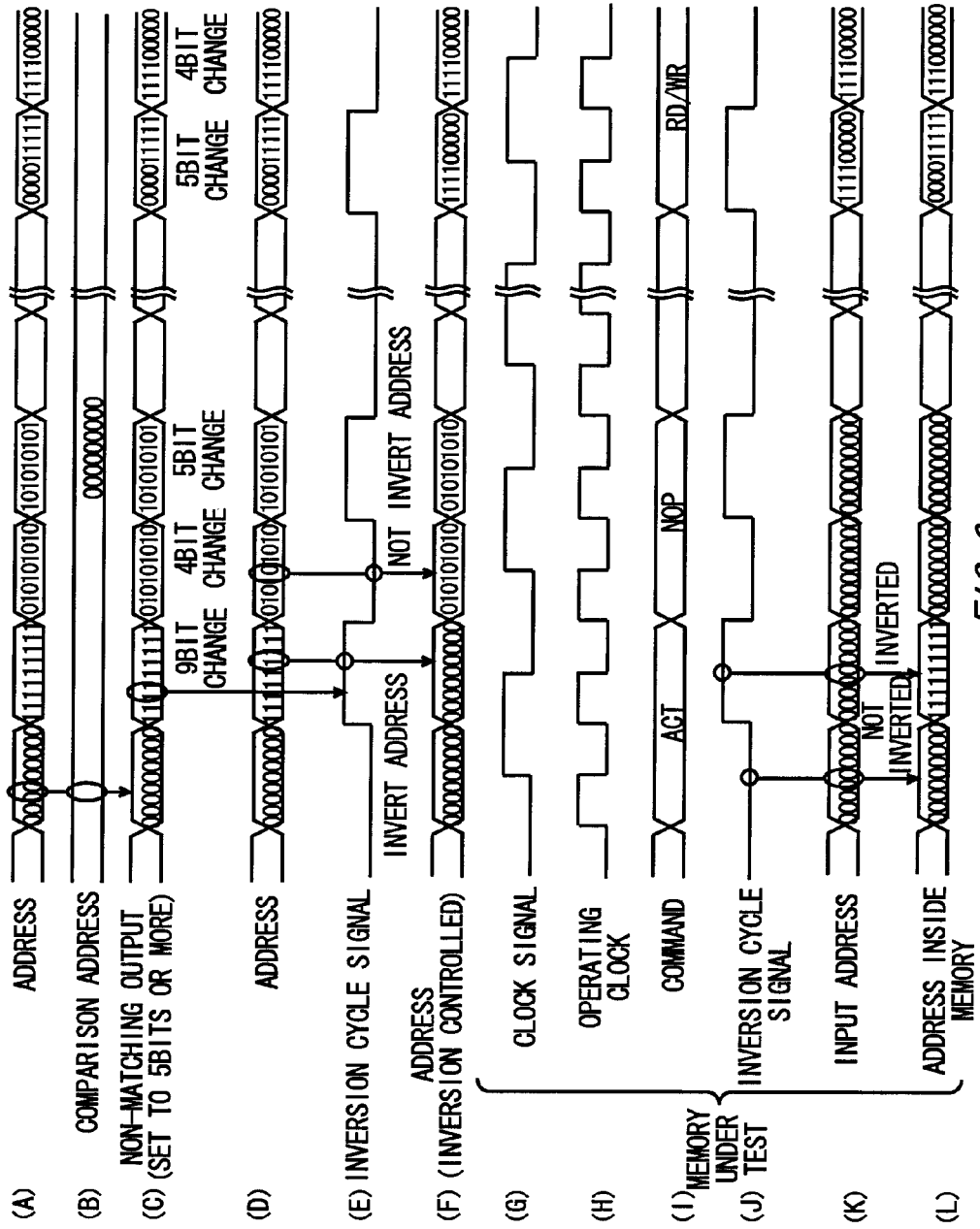
FIG. 6 shows an example of the timing chart of each signal of the test apparatus 10 according to the present embodiment.

FIG. 6 shows an example of the timing chart of each signal of the test apparatus 10 and of the memory under test 200 according to the present embodiment. (A) in FIG. 6 shows the address generated by the address generator 38 (i.e., selected and rearranged address). (B) in FIG. 6 shows a comparison address. (C) in FIG. 6 shows an output from the non-matching circuit 62. (D) in FIG. 6 shows the address generated by the address generator 38 (i.e., selected and arranged address), similar to (A) of FIG. 6. (E) in FIG. 6 shows an inversion cycle signal. (F) in FIG. 6 shows an inversion controlled address.

(G) in FIG. 6 shows a clock signal received by the memory under test 200. (H) in FIG. 6 shows an operating clock of the memory under test 200. (I) in FIG. 6 shows a command received by the memory under test 200. (J) in FIG. 6 shows an inversion cycle signal received by the memory under test 200. (K) in FIG. 6 shows an address received by the memory under test 200. (L) in FIG. 6 shows an address inside the memory under test 200.

In an example, the test apparatus 10 outputs an address of 9 bits, to the memory under test 200. In this case, if the address generated by the address generator 38 has changed by 5 bits or more from the comparison address, the inversion control section 42 sets the inversion cycle signal to H logic, and inverts the address supplied to the memory under test 200. If the address generated by the address generator 38 has experienced change from the comparison address which is less than by 5 bits or more, the inversion control section 42 sets the inversion cycle signal to L logic, and does not perform inversion on the address supplied to the memory under test 200.

The memory under test 200 receives the address and the inversion cycle signal from the test apparatus 10. When the inversion cycle signal is L logic, the controller inside the memory under test 200 acquires the inputted address in the non-inverted state, and accesses the recording region. When the inversion cycle signal is H logic, the controller inside the memory under test 200 acquires the inputted address after inverting it, and accesses the recording region.

The explained test apparatus 10 can reduce the amount of change of the address outputted to the memory under test 200. By doing so, the test apparatus 10 can restrain the power consumption incident to address transfer.

Figure 7:
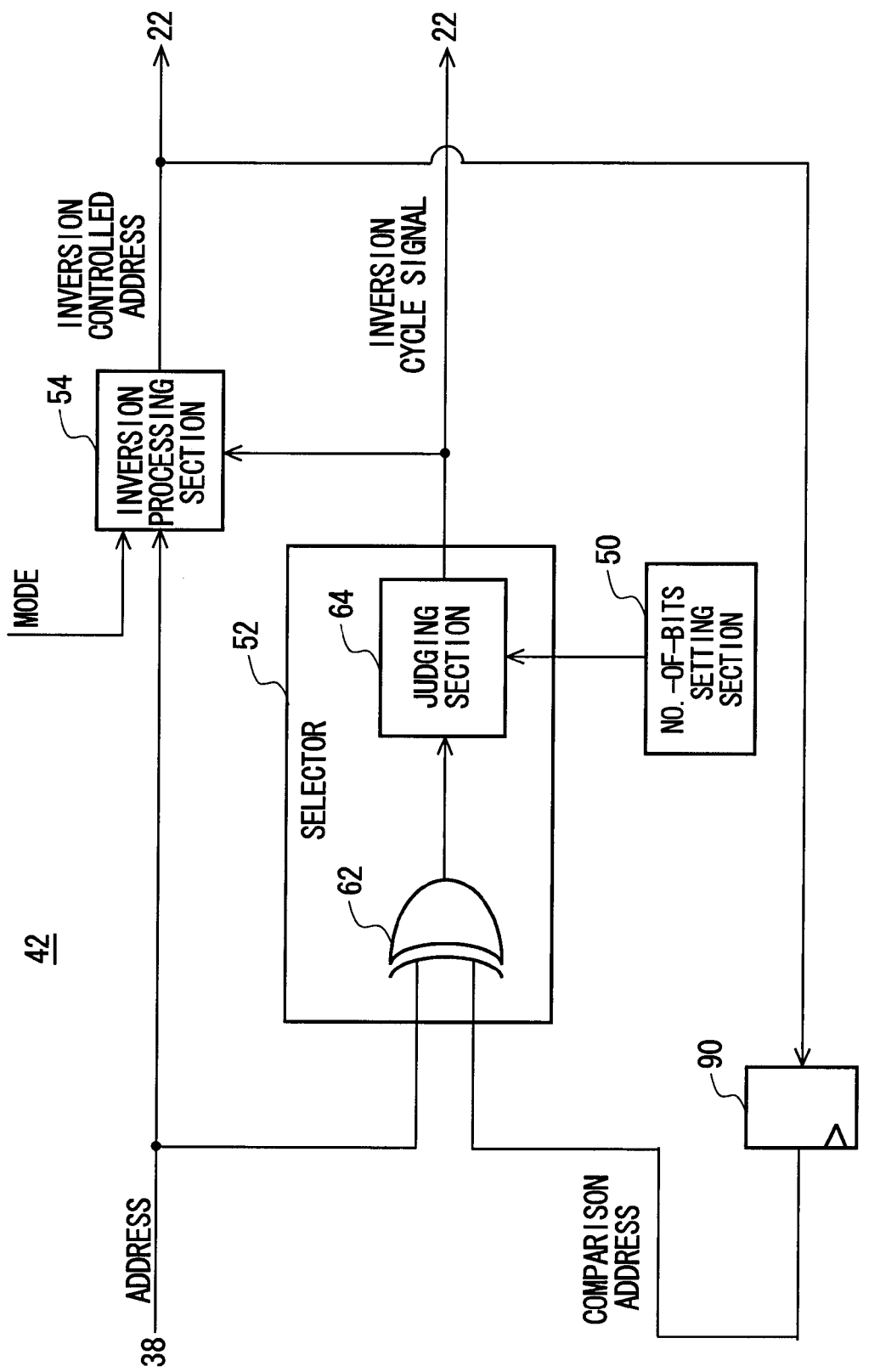
FIG. 7 shows a third example of the configuration of the inversion control section 42 according to the present embodiment.

FIG. 7 shows a third example of the configuration of the inversion control section 42 according to the present embodiment. The inversion control section 42 according to the third example is roughly the same in function and configuration as the inversion control section 42 in the first example shown in FIG. 3 and as the inversion control section 42 in the second example shown in FIG. 4. Therefore, there will be no explanation provided below for the common function and configuration to those of the inversion control section 42 shown in FIG. 3 and the inversion control section 42 shown in FIG. 4.

The inversion control section 42 according to the third example further includes an address retaining section 90. The address retaining section 90 receives the address supplied to the memory under test 200 in the cycle immediately before it, as a comparison address, and retains one cycle of the address. When the address generated by the address generator 38 has been changed from the comparison address retained in the address retaining section 90 by the predetermined number of bits or more, the selector 52 selects to perform bit inversion on the address. By doing so, the inversion control section 42 can reduce the amount of change for each bit of an address, even when it attempts to consecutively output addresses over a plurality of cycle periods.

In addition, the inversion processing section 54 can switch between outputting of inversion controlled addresses or addresses not subjected to inversion control, in each mode set from outside. In such a case, in response to setting of the mode from outside which calls for outputting the address not subjected to inversion control, the inversion processing section 54 can stop the function of performing bit inversion to the address, and outputs the address not subjected to inversion. This embodiment enables the inversion processing section 54 to test the memory under test 200 in the setting not to perform inversion control to an address.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus comprising:
   an address generator that generates an address of a memory under test;
   a selector that selects whether to perform bit inversion on the address generated by the address generator before supplying the address to the memory under test;
   an inversion processing section that outputs the address generated by the address generator after performing bit inversion on the address if the selector has selected in the affirmative, and outputs the address generated by the address generator without performing any bit inversion on the address if the selector has selected in the negative; and
   a supply section that supplies, to the memory under test, the address having undergone inversion control outputted from the inversion processing section and an inversion cycle signal that indicates whether the address outputted from the inversion processing section is bit inverted or not.

2. The test apparatus according to claim 1, wherein the selector selects to perform bit inversion on the address generated by the address generator, when the address has been changed at least by a predetermined number of bits from a comparison address.

3. The test apparatus according to claim 2, wherein the selector selects to perform bit inversion on the address, when the address has been changed from the comparison address by bits corresponding to ½ of a bit width of the address or more.

4. The test apparatus according to claim 2, wherein the selector selects to perform bit conversion on the address, when the address has been changed at least by a predetermined number of bits from the comparison address which has been fixed in advance.

5. The test apparatus according to claim 4, wherein the address generator generates a predetermined address in a cycle in which the memory under test does not receive any address, and the selector receives, as the comparison address, the address generated in a cycle in which the memory under test does not receive any address, and selects to perform bit inversion on the address when the address has been changed from the comparison address at least by a predetermined number of bits.

6. The test apparatus according to claim 5, wherein the address generator designates a recording region of the memory under test to be accessed by outputting two consecutive addresses.

7. The test apparatus according to claim 2, wherein the selector receives, as the comparison address, the address supplied to the memory under test in a cycle immediately therebefore, and selects to perform bit inversion on the address when the address has been changed from the comparison address by a predetermined number of bits or more.

8. The test apparatus according to claim 2, further comprising:
   a number-of-bits setting section that sets a number of bits equal to or lower than a bit width of the address to the selector, wherein
   the selector selects to perform bit inversion on the address generated by the address generator, when the address has been changed from the comparison address at least by a number of bits having been set by the number-of-bits setting section.

9. The test apparatus according to claim 1, wherein the inversion processing section is operable to stop a function to perform bit inversion on the bit according to a particular setting, and to output the address not having undergone bit inversion.

10. A test method for testing a memory under test, comprising:
    generating an address of a memory under test;
    selecting whether to perform bit inversion on the generated address before supplying the address to the memory under test;
    outputting the generated address after performing bit inversion on the address if it has been judged in the affirmative in the selecting step, and outputting the generated address without performing any bit inversion on the address if it has been judged in the negative in the selecting step; and
    supplying, to the memory under test, the outputted address having undergone inversion control and an inversion cycle signal that indicates whether the outputted address is bit inverted or not.

* * * * *